US012782394B2

(12) United States Patent
Poechmueller

(10) Patent No.: US 12,782,394 B2
(45) Date of Patent: Nov. 3, 2026

(54) MULTIPLE TILE WAFER TESTER

(71) Applicant: Intelligent Memory Limited, Kwai Chung (HK)

(72) Inventor: Peter Poechmueller, Jinan (CN)

(73) Assignee: Intelligent Memory Limited, Kwai Chung (HK)

( * ) Notice: Subject to any disclaimer, the term of this patent is extended or adjusted under 35 U.S.C. 154(b) by 153 days.

(21) Appl. No.: 18/932,065

(22) Filed: Oct. 30, 2024

(65) Prior Publication Data

US 2026/0118384 A1 Apr. 30, 2026

(51) Int. Cl.
*G01R 1/073* (2006.01)
*G01R 1/067* (2006.01)

(52) U.S. Cl.
CPC ....... *G01R 1/07342* (2013.01); *G01R 1/0675* (2013.01)

(58) Field of Classification Search
CPC .............. G01R 1/07342; G01R 1/0675; G01R 31/2889
See application file for complete search history.

(56) References Cited

U.S. PATENT DOCUMENTS 4,902,969 A 2/1990 Gussman
5,966,021 A 10/1999 Eliashberg
6,259,260 B1 * 7/2001 Smith ................ G01R 31/2886 324/756.05
6,357,023 B1 3/2002 Co
6,467,053 B1 10/2002 Connolly
6,910,162 B2 6/2005 Co
7,478,290 B2 1/2009 Co
11,009,550 B2 5/2021 Champoux
2002/0056057 A1 5/2002 Co
2003/0137862 A1 7/2003 Brunelle
(Continued)

FOREIGN PATENT DOCUMENTS

CN 217846404 U 11/2022
DE 102005060930 A1 11/2006
(Continued)

OTHER PUBLICATIONS

Office Action dated Dec. 23, 2025, Taiwan Appl. No. 114129215.
(Continued)

*Primary Examiner* — Jermele M Hollington
*Assistant Examiner* — Zannatul Ferdous
(74) *Attorney, Agent, or Firm* — Joseph A. Andelin; Fish IP Law, LLP

(57) ABSTRACT

A motherboard assembly for testing wafers is described. The motherboard assembly includes a probe card having a plurality of needles disposed in a center region and a plurality of micro connectors disposed outside the center region. Each micro connector is communicatively coupled with a plurality of needles. The motherboard assembly also includes a lower motherboard comprising a plurality of tiles, each tile having at least one processor and at least one memory channel. Each memory channel is communicatively coupled with a micro connector of the probe card. A gap vertically separates and insulates the lower motherboard from the probe card. A wafer is sized and dimensioned to rest on the needles of the probe card for testing.

20 Claims, 17 Drawing Sheets

(56) References Cited

U.S. PATENT DOCUMENTS

| | | | | |
|---|---|---|---|---|
| 2004/0230880 | A1* | 11/2004 | Co | G11C 29/56016 714/724 |
| 2006/0002161 | A1 | 1/2006 | Dangelo | |
| 2006/0242468 | A1 | 10/2006 | Kang | |
| 2008/0126863 | A1 | 5/2008 | Co | |
| 2012/0191402 | A1 | 7/2012 | Filler | |
| 2014/0210505 | A1* | 7/2014 | Chen | G01R 1/0735 324/756.03 |
| 2017/0184663 | A1* | 6/2017 | Wu | G01R 31/2891 |
| 2020/0056057 | A1 | 2/2020 | Nagarajan | |

FOREIGN PATENT DOCUMENTS

| | | | |
|---|---|---|---|
| DE | 101 26 591 | B4 | 1/2016 |
| KR | 102012509 | B1 | 8/2019 |
| TW | 200910368 | A | 3/2009 |
| TW | 202043782 | A | 12/2020 |

OTHER PUBLICATIONS

Office Action dated May 28, 2024, German Appl. No. 10 2023 134 162.6.
Office Action dated Aug. 6, 2024, German Appl. No. 10 2023 134 156.1.
Office Action dated Oct. 17, 2024, Taiwan Appl. No. 112151253.
Office Action dated Nov. 20, 2024, Taiwan Appl. No. 112151254.
Office Action dated Jun. 5, 2025, U.S. Appl. No. 18/372,497.
Office Action dated Jun. 11, 2025, U.S. Appl. No. 18/371,415.
Office Action dated May 15, 2025, Taiwan Appl. No. 112151254.

* cited by examiner

MULTIPLE TILE WAFER TESTER

FIELD OF THE INVENTION

The field of the invention is memory test systems.

BACKGROUND

The background description includes information that may be useful in understanding the present invention. It is not an admission that any of the information provided herein is prior art or relevant to the presently claimed invention, or that any publication specifically or implicitly referenced is prior art.

DRAM and Flash memory technologies have been well-known for many years. Over time, the basic underlying technology has remained essentially the same with interfaces changing over time, e.g., Fast Page Mode (FPM), Extended Data Out (EDO), Synchronous DRAM (SDRAM), Double Data Rate 1-4 (DDR1, DDR2, DDR3, DDR4, DDR5), etc. In some applications the DRAM components are soldered onto PCB substrates to form a module, e.g. DIMM module to be plugged into motherboards of computer systems.

Testing of packaged memory components is traditionally done in several steps and multiple insertions. Typically, packaged DRAM components are first submitted to a burn-in ("BI") test. This test is performed with high parallelism in expensive BI systems. For example, current BI systems can cost US$500,000 to $1,000,000 per test system. Because of the high number of parts tested and contacted, such systems run at low frequencies of around 5-20 MHz, which is far from normal operation frequency of such semiconductors being 1 GHz. To reduce need for signaling, most approaches use internal on chip test circuitry to compress all data signal onto a single external data pin (e.g., reduce 16DQ to a single DQ) and other test modes to modify internal voltages for more effective stress of memory components. The purpose of the BI test is to age semiconductors in several hours of stress to avoid infancy fails at the customer level. Related stress tests are typically performed at elevated voltages and temperatures up to 125 degrees Celsius. Typically, thousands of components are tested in parallel in a single BI test system.

After a successful BI test, components will be submitted to weak cell or core test. Those tests are designed to identify weak DRAM memory cells which might fail at the customer level due to poor memory cell retention or other weaknesses. Tests are performed on expensive automatic test equipment costing typically one to three million US dollars, operating at frequencies of 200-500 MHz and testing 200-1000 components in parallel. Due to the large amount of signals supplied, some signals like address/command will be shared between multiple components and chip supplier-provided test modes for data compression, such that a reduced amount of DQ need to be contacted (e.g. only 4 data signals instead of full 16 signals by data compression (read) and replication (write) methods). Such tests might be performed at different temperatures. For example, a set of components can be tested at high temperatures (e.g. at 95 degrees Celsius), be removed from the system and at a later time on a different test system be tested at a very low temperature (e.g., −40 degrees Celsius). Removal is needed because a test handler cannot change temperature so quickly without other adverse impact. A handler is attached to the test system for feeding DRAM components to be tested onto the test head and provide intended test temperature.

After a successful weak cell test, components will be submitted to a speed test conducted by a DRAM speed tester, as is known in the art. During this test all electrical signals of the components need to be connected to the speed tester to make sure all signals and circuitry are fully functional. A DRAM with 16 DQ will have to be connected to 16 individual DQ signals without compression modes. Therefore, parallelism of such test systems is relatively low in the range of 50-200 components. Also, parts have to be operated at full system speed in the range of 1 GHz. Therefore, such systems are very costly, typically costing from 3-5 million dollars. Tests might also be required at different temperatures, (e.g., 95 C and later again at −40 C) to guarantee customer specification of fully functional parts are met.

As mentioned above, DRAM packaged components are submitted to a set of at least 3 different test systems for BI, weak cell and speed test. Some test steps might have to be done at different temperatures requiring up to 5 times being submitted to test. This means components are handled up to 5 times or more if retest is required. This causes handling damage to contacts (e.g., the contact balls of FBGA components) which is not desirable but cannot be avoided in today's test approaches. In addition, very costly tooling is required to feed and handle DRAM components within a test handler and to connect them electrically to the test head. For example, a Hifix electrically connects the component to the tester signal channels. Such tooling is product-specific and has to be provided for each individual DRAM. A FPGA 78 package of 9×11 mm needs totally different tooling and Hifix than e.g. FBGA 96 package of 7×10 mm. A single set of tooling for one product can easily exceed US $250,000.

In view of the above, the reader can readily appreciate that existing test flows of advanced semiconductors are costly and complicated. Additionally, the nature of the testing risks damaging the components themselves. Thus, there is still a need for a simpler, safer way to test DRAM components. There is also still a need to provide testing systems and methods that can be used for DRAM components and wafers.

SUMMARY OF THE INVENTION

The inventive subject matter provides apparatus, systems and methods in which a motherboard assembly for wafer testing comprises a probe card coupled with a lower motherboard and separated by a gap. The probe card has a plurality of needles disposed in a center region of the probe card and extending from the top surface of the probe card. The needles are used to electrically connect with the surface of a wafer for testing. The bottom side of the probe card has a plurality of micro connectors disposed outside the center region. Each micro connector is electrically connected with a plurality of needles. The lower motherboard is comprised of a plurality of tiles, each tile having at least one processor, CPU or other computational unit (e.g. FPGA, ASIC) and at least one memory channel. Each memory channel is communicatively coupled with a micro connector of the probe card.

In some embodiments, the plurality of tiles are identical and at least some of the tiles have a different rotational orientation. The orientation of the tiles is selected to minimize the electrical path from the CPU of the lower motherboard to the micro connectors of the probe card. The rotational orientation of the tiles is also selected to prioritize use of the center region of the probe card for needles rather than micro connectors. The micro connectors are disposed around a perimeter of the center region of the probe card. A wafer is sized and dimensioned to cover the center region of the probe card. This probe card design allows more needles to be used for testing the wafer over a larger surface of the wafer, and reduces the number of touchdowns required to test the wafer.

In one particular embodiment, the number of tiles is six, wherein two tiles (in a first column) have a first rotational orientation, two other titles (in a third column) have a second rotational orientation that is 180 degrees from the first rotational orientation, and two other tiles (in a second column) have a top tile with a third rotational orientation that is 90 degrees counterclockwise from the first rotational orientation, and a bottom time with a fourth rotational orientation that is 90 degrees clockwise from the first rotational orientation.

The inventive subject matter also provides apparatus, systems and methods in which a tester board system comprises a frame dimensioned to receive at least two motherboard assemblies. Each of the at least two motherboard assembly comprises: a probe card; a plurality of needles disposed on the top surface of the probe card; at least one micro connector disposed on the bottom surface of the probe card; a lower motherboard vertically separated from the probe card by a gap; at least one CPU disposed on the lower motherboard; and at least one support connector connecting the micro connector of the probe card with the CPU of the lower motherboard.

Various objects, features, aspects and advantages of the inventive subject matter will become more apparent from the following detailed description of preferred embodiments, along with the accompanying drawing figures in which like numerals represent like components.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The following description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

DETAILED DESCRIPTION

Throughout the following discussion, numerous references will be made regarding servers, services, interfaces, engines, modules, clients, peers, portals, platforms, or other systems formed from computing devices. It should be appreciated that the use of such terms, is deemed to represent one or more computing devices having at least one processor (e.g., ASIC, FPGA, DSP, x86, ARM, ColdFire, GPU, multi-core processors, etc.) programmed to execute software instructions stored on a computer readable tangible, non-transitory medium (e.g., hard drive, solid state drive, RAM, flash, ROM, etc.). For example, a server can include one or more computers operating as a web server, database server, or other type of computer server in a manner to fulfill described roles, responsibilities, or functions. One should further appreciate the disclosed computer-based algorithms, processes, methods, or other types of instruction sets can be embodied as a computer program product comprising a non-transitory, tangible computer readable media storing the instructions that cause a processor to execute the disclosed steps. The various servers, systems, databases, or interfaces can exchange data using standardized protocols or algorithms, possibly based on HTTP, HTTPS, AES, public-private key exchanges, web service APIs, known financial transaction protocols, or other electronic information exchanging methods. Data exchanges can be conducted over a packet-switched network, the Internet, LAN, WAN, VPN, or other type of packet switched network.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1A:
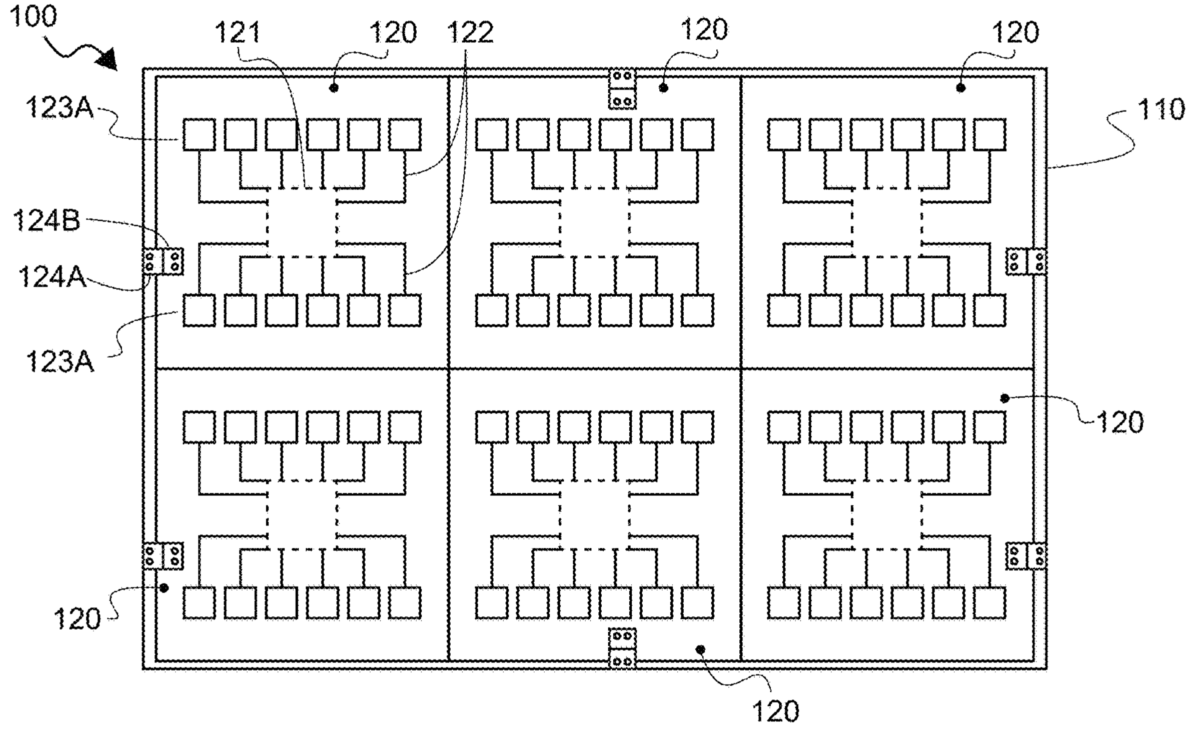
FIGS. 1A and 1B show top views of an assembled tester board system, that includes a frame and multiple motherboards disposed thereon, according to two variations of embodiments of the inventive subject matter.
Figure 1B:
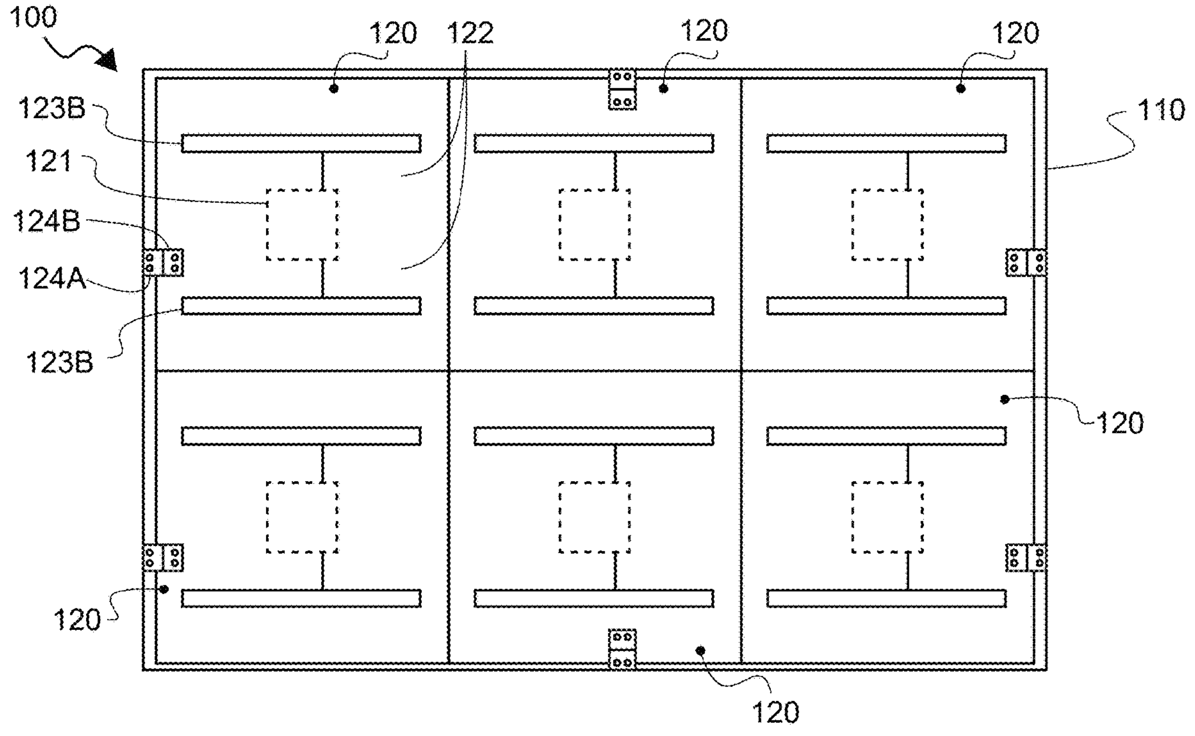

FIGS. 1A and 1B show top views (otherwise referred to as front views) of an assembled tester board system 100, that includes a frame 110 and multiple motherboards 120 disposed thereon of embodiments of the inventive subject matter. The embodiment of FIG. 1A shows memory channels 123 in the form of memory component sockets 123A configured to receive memory components for testing. The embodiment of FIG. 1B shows memory channels 123 in the form of memory module slots 123B that receive memory modules for testing. Each of the embodiments of FIG. 1A, 1B will be discussed in greater detail below. In each of FIGS. 1A-1B, the CPU 121 (or other processor or computational unit like e.g. FPGA or ASIC) that is disposed on the underside of a motherboard 120 is shown via dotted lines.

Figure 1C:
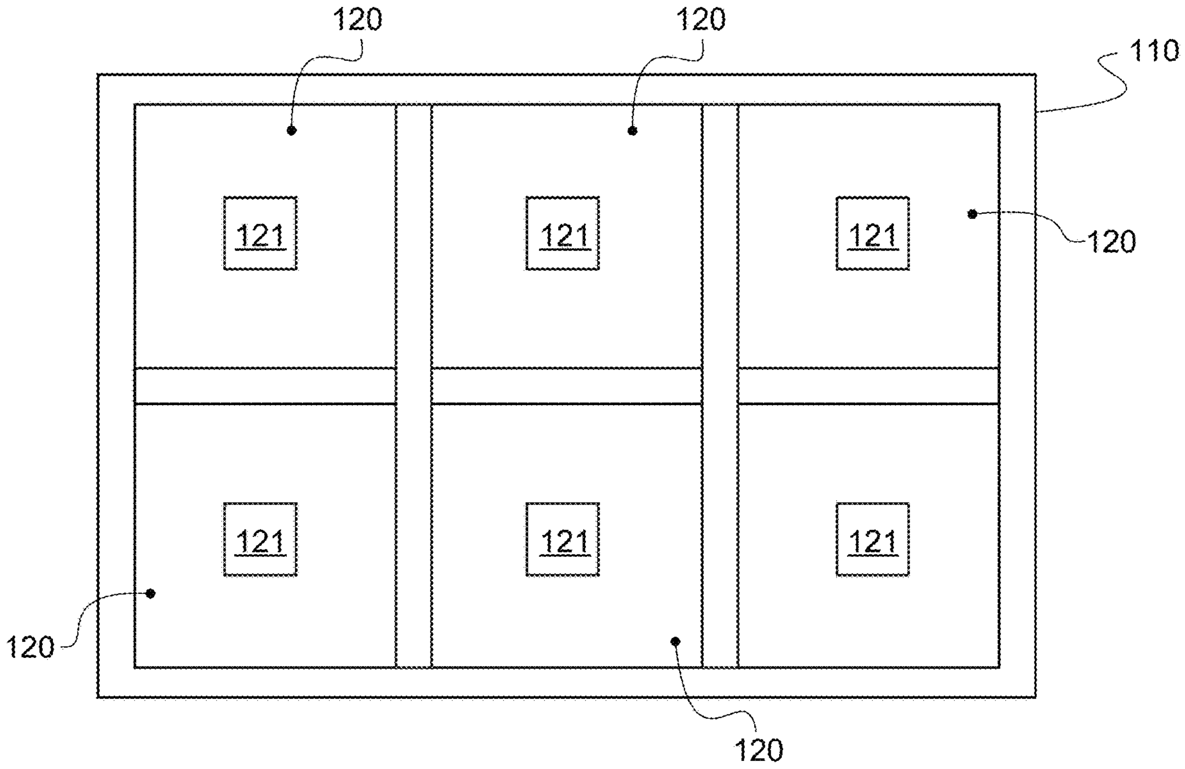
FIG. 1C shows a bottom view of the plurality of motherboards of FIG. 1A or 1B attached to the frame.

FIG. 1C shows a bottom view (also referred to as a back view) of the plurality of motherboards 120 of FIG. 1A or 1B attached to the frame 110. For the sake of clarity and simplicity in illustration, the memory channels 123 (memory component sockets 123A of FIG. 1A, memory module slots 123B of FIG. 1B) are not shown via dotted lines. The memory component sockets 123A of FIG. 1A and the memory module slots 123B of FIG. 1B can be soldered onto the motherboards 120.

The motherboards 120 are attachable to and removable from the frame 110. In preferred embodiments, the motherboards 120 can be attached to the frame 110 via plastic screws that minimize temperature transfer between the top side and bottom side of the motherboard 120. Screws of other types of materials with low heat transfer are also suitable. Other types of suitable attachment methods are also contemplated.

Without restricting the general applicability of our approach, we further describe the invention by example of DRAM (Dynamic Random Access Memory) test flow.

Figure 2:
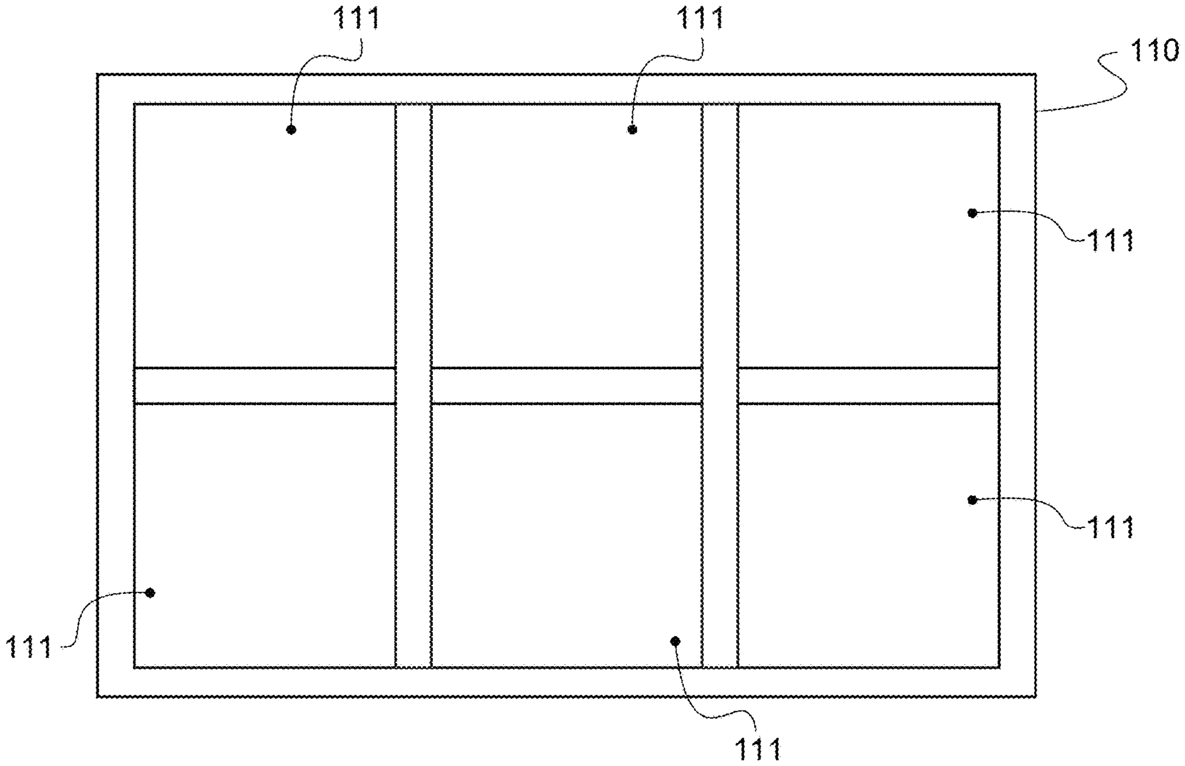
FIG. 2 provides a view of the frame in isolation.

FIG. 2 shows the frame 110 in isolation. The frame 110 is made of a sturdy material. Suitable materials can include, but are not limited to metals such as aluminum, or other materials such as carbon composites, glass fiber composites, or other stiff non-metal materials. The frame 110 includes spaces or cavities 111. When the motherboards 120 are disposed (e.g., mounted) onto the frame, the cavities 111 allow for underside access to the underside components of the motherboards 120. When the motherboards 120 are mounted onto the frame 110, components on the underside of the motherboards 120 such as the CPU 121 will stick out into the cavity 111.

The frame 110 of FIGS. 1A-2 is shown having six motherboards 120 mounted thereto, but it is contemplated that a frame 110 can have more or less motherboards 120 mounted thereto. For example, other configurations are contemplated that can fit four to ten motherboards 120.

The embodiment shown in FIGS. 1A-2 is dimensioned to be the size of a standard BI board. The reader will appreciate that the systems and methods of the inventive subject matter negate the need for existing large, expensive BI test systems. However, the use of the standard BI sizing allows for the use of other aspects of the standard BI process such as automatic loaders and unloaders that load/unload memory components. Additionally, software and analysis of socket performance can be performed in a similar manner to existing BI systems.

In the example shown in FIGS. 1A and 1B, the top of motherboards 120 align on the frame 110 such that they are touching, and the frame 110 is not visible between the boards. Aligning the motherboards 120 such that the edges touch creates a continuous surface that serves to separate and thermally isolate the top side of the boards 120 having the memory channels 123 from the underside of the boards that have the CPU 121 and other sensitive electronics components.

The frame 110 includes an electrical connector 124A that is aligned to couple with an electrical connector 124B of a motherboard 120 to provide power to the CPU 121 and other components of the motherboard 120. As seen in FIG. 1A, the frame 110 can include connectors 124A to connect with connectors 124B of all of the installed motherboards 120.

Figure 3A:
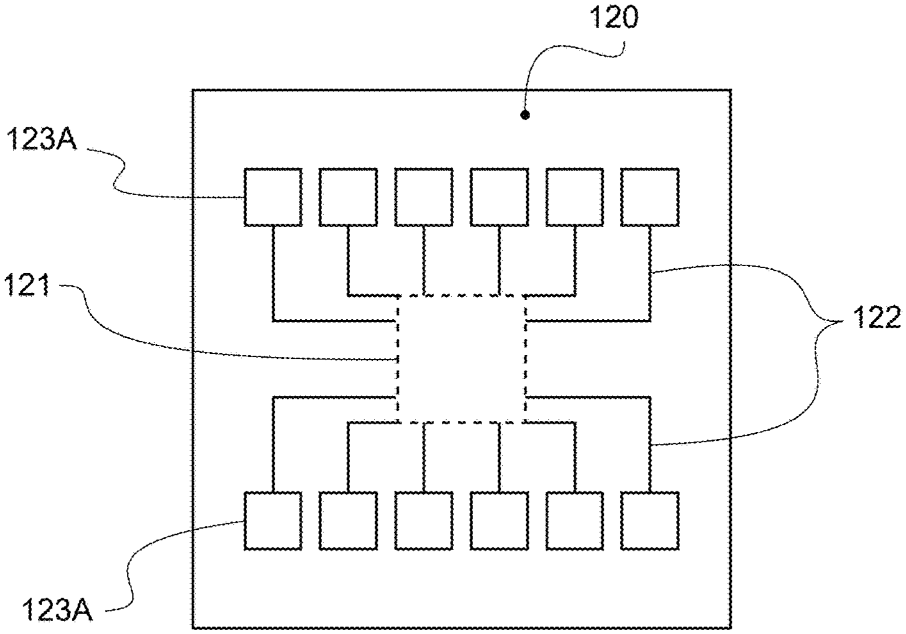
FIGS. 3A and 3B show front views in isolation of a motherboard of FIG. 1A (in FIG. 3A) and FIG. 1B (in FIG. 3B), according to embodiments of the inventive subject matter.
Figure 3B:
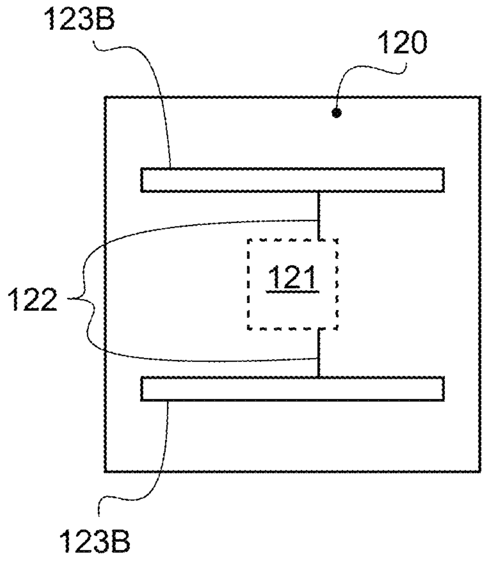
Figure 3C:
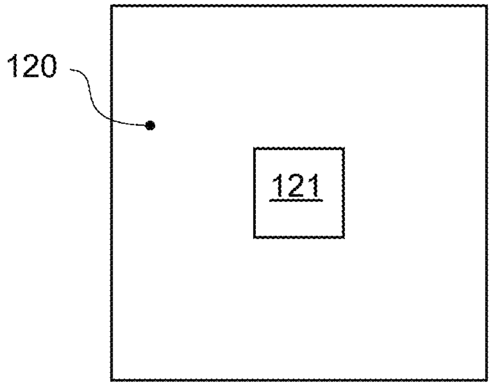
FIG. 3C provides a bottom view of the motherboard and its components, according to embodiments of the inventive subject matter.

FIGS. 3A and 3B show front views in isolation of a motherboard 120 of FIG. 1A (in FIG. 3A) and FIG. 1B (in FIG. 3B), according to embodiments of the inventive subject matter. FIG. 3C shows the back (underside) view of the motherboard 120 of FIGS. 3A, 3B.

The motherboard 120 shown in FIGS. 3A and 3B include a CPU 121 (shown in dotted lines) that is electronically connected via connections 122 to module slots 123A (in FIG. 3A) and memory component sockets 123B (in FIG. 3B). The memory component sockets 123A are configured to receive corresponding memory components for testing and the memory module slots 123B are configured to receive corresponding memory modules that in turn contain one or more memory components for testing. In FIGS. 1A-1B and 3A-3B, the CPU 121 is shown in dotted lines to illustrate that it is on the opposite side of the motherboard 120.

As seen in FIGS. 3A and 3B, the CPU 121 is disposed on a bottom side (also referred to as the back side) of the motherboard 120 via its depiction in dotted lines whereas the memory channels 123 (the memory component sockets 123A and/or the module slots 123B) are on or near the top side (also referred to as the front side) of the motherboard 120.

This arrangement enables the CPU 121 to be protected against the temperature variations provided by a microclimate chamber when testing memory units or memory components are inserted into the memory component sockets 123A and/or the module slots 123B, respectively. For example, during testing the temperature around the CPU 121 can differ from the temperature around the memory channels 123 (and the memory module or memory component connected thereto) by at least 5 degrees Celsius.

As with FIGS. 1A-1B, in FIGS. 3A and 3B, the CPU 121 is shown via dotted lines to show that they are on the opposite side of the motherboard 120 from the memory component sockets 123A (in FIG. 3A) and the memory module slots 123B (in FIG. 3B). These memory channels 123 are not shown in FIG. 3C via dotted lines so as to keep the figure clear.

In embodiments of the inventive subject matter, the motherboard 120 also includes wireless communication components including a wireless antenna that is communicatively coupled with the CPU 121 and that enables the CPU 121 to send and receive data to and from an external computing device. The wireless antenna can be integral to the CPU 121, such as in the embodiments shown here, or can be a separate antenna component. In order to protect the antenna and other communications components from the temperatures endured in the testing environment, the antenna and other communications components (when separate from the CPU 121) are also located on the lower side of the motherboard 120, opposite the memory channels 123. Examples of contemplated wireless data transmission modalities includes WiFi, Bluetooth, NFC, etc. In embodiments of the inventive subject matter, some or all of the communications functions and/or command functions can be handled by a separate board such as a Raspberry Pi board that can issue commands to the components on the motherboard 120.

Figure 3D:
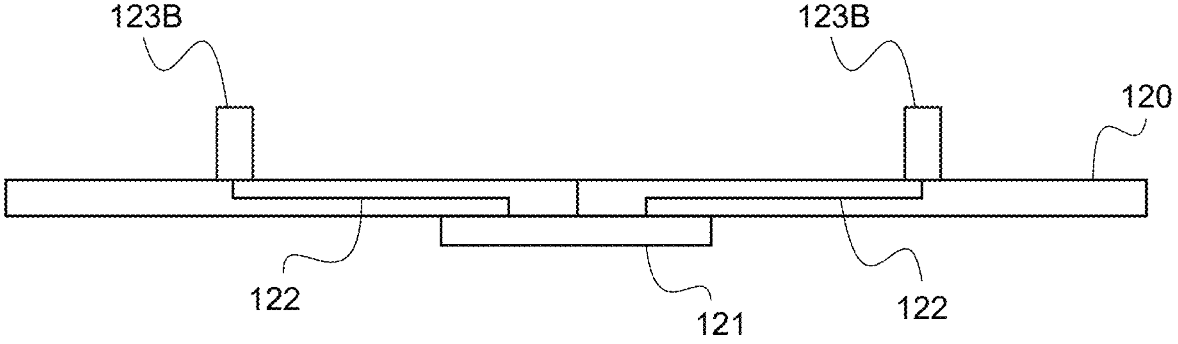
FIG. 3D shows a cross-section view of the motherboard according to the embodiments of FIG. 3B.

FIG. 3D shows a cross-section of the motherboard 120 that illustrates the connectors 122 traversing the width of the motherboard 120 to connect the CPU 121 on the underside of the board with the memory channels 123 (in this example, the module slots 123B) the of the top side of the motherboard 120. While only the embodiment shown in FIG. 3D only shows module slots 123B, the embodiment having the memory component sockets 123A would be the same with the difference being the component sockets 123A in the place of the module slots 123B.

In each of the embodiments shown in FIGS. 1A-1B, the motherboards 120 attached to each frame 110 are all shown to be identical. In other embodiments the motherboards 120 can be different to accommodate different number of memory units to be tested, or to allow for the simultaneous testing of different types of memory units.

The tester board system 100 of FIGS. 1A-1C show the motherboards 120 arranged along a single horizontal plane. In these embodiments, the tester board system 100 (having the motherboards 120) has dimensions of between 30 cm×30 cm and 2 m×2 m (including the frame 110). In preferred embodiments, the dimensions are 40 cm×60 cm, including the frame.

Figure 4A:
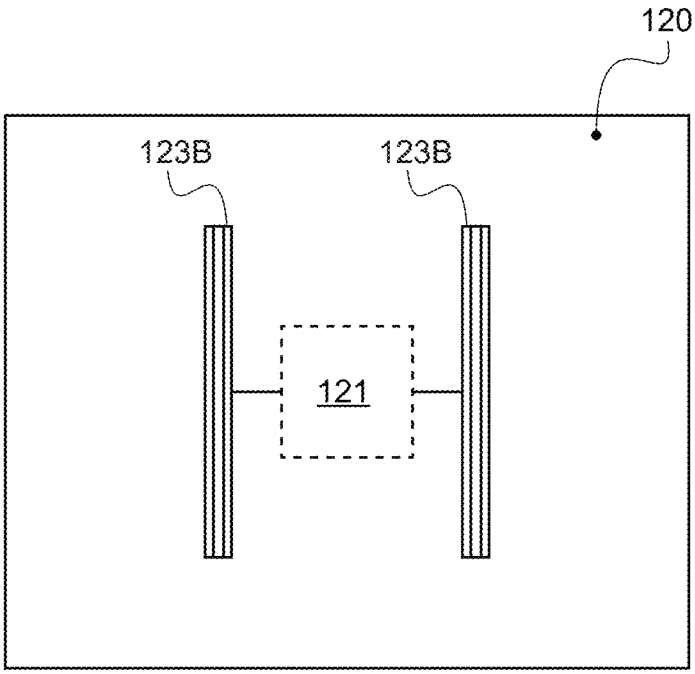
FIGS. 4A-4B show front and perspective views, respectively, of a motherboard according to another embodiment of the inventive subject matter.
Figure 4B:
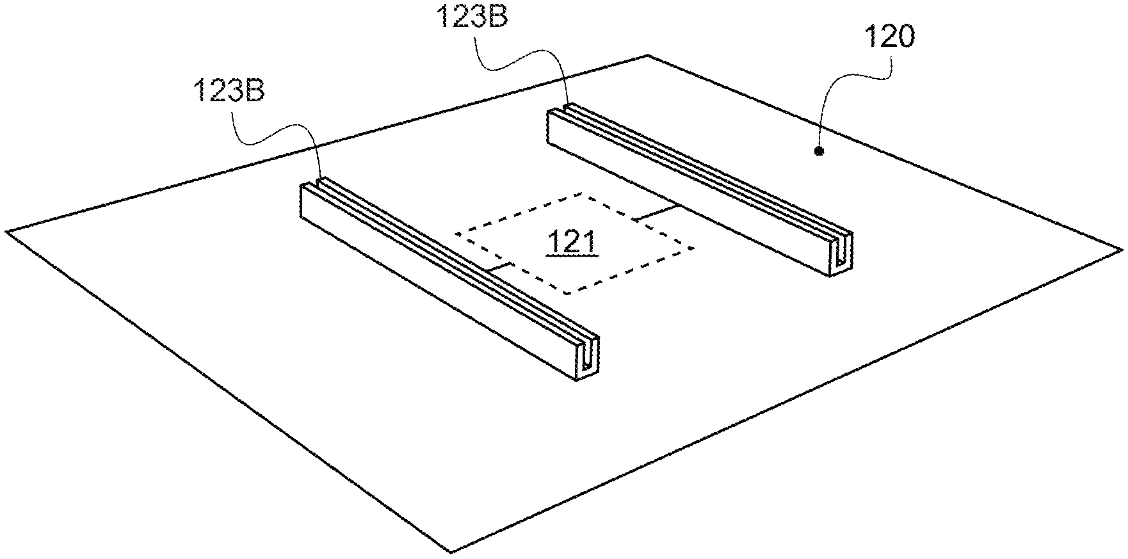

FIGS. 4A-4B show top and perspective views, respectively, of an embodiment of the inventive subject matter whereby the memory channels 123 (module slots 123B, in this example) are disposed such that when a memory module is inserted, it is vertically aligned with the motherboard 120 (e.g., it is oriented perpendicular to the motherboard 120).

Figure 5A:
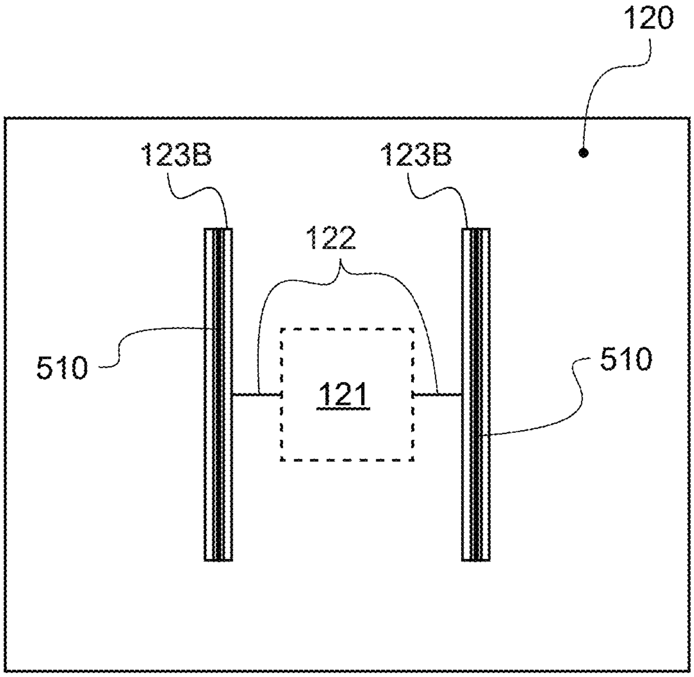
FIGS. 5A-5B show the embodiments of FIGS. 4A-4B, respectively, with a memory module inserted into the memory module slot.
Figure 5B:
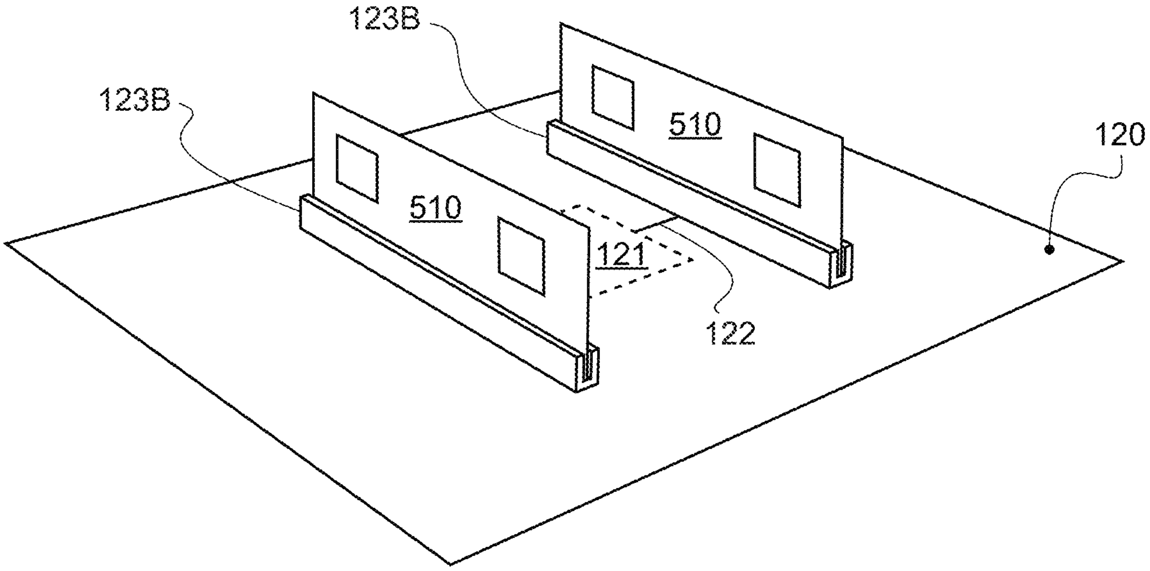

FIGS. 5A-5B show the embodiment of FIGS. 4A-4B with memory modules 510 inserted into the module slots 123B. As can be seen in FIGS. 4A-4B, the memory modules 510 extend vertically (e.g., not more than 15 degrees off-vertical) from the motherboard 120. Each module 510 can include one or more memory component socket that can receive a memory component for testing (represented by the squares on each module 510 visible in FIG. 5B).

Figure 6:
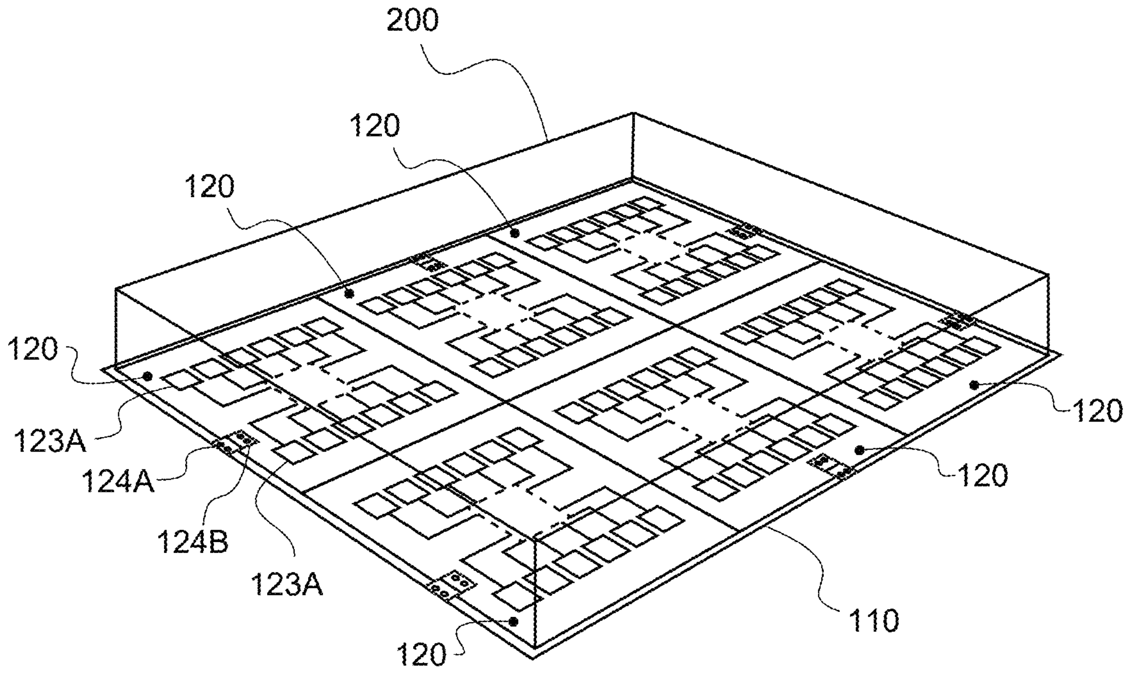
FIG. 6 shows an assembled tester system with a micro-climate chamber disposed on the top side.

FIG. 6 illustrates the system 100 of FIG. 1A with a microclimate chamber 200 disposed on the upper or top side of the assembled system 100. The microclimate chamber 200 can provide a heated and/or cooled environment to test memory components attached to the motherboards 120. The microclimate chamber 200 can have a heat source and/or a cooling source (not pictured for clarity) that provides a heated environment and/or a cooled environment for component testing.

As noted above, the edges of motherboards 120 touch each other when attached to the frame 110, creating a continuous or nearly-continuous surface without gaps in between the motherboards 120. This helps to isolate the underside of the motherboards 120 from the climates produced by the microclimate chamber 200.

In the embodiment shown, the microclimate chamber 200 is dimensioned to fit over all of the motherboards 120 attached to the frame 110. In other embodiments, it is contemplated that the microclimate chamber 200 can be smaller, such that it fits over some of but not all of the motherboards 120. The astute reader will readily recognize that the microclimate chamber 200 negates the need to use large traditional, expensive BI testing equipment.

The above embodiments serve to provide a difference in temperature between the memory components being tested on a motherboard and a CPU on the same board. However, PCBs can be relatively thin and having layers of metal traces. Therefore, if memory components on the front side are exposed for longer times to very high or low temperature, such temperature will finally be transferred to the backside resulting in damage or extensive thermal mechanical stress or water condensation. As such, it may be desirable to further isolate the CPU and other sensitive electronic components from the excessive temperatures needed for the testing of semiconductor memory components. Thus, in embodiments of the inventive subject matter, the motherboard further separates the CPU from the memory components being tested by vertically spacing out the components from the CPU.

Figure 7A:
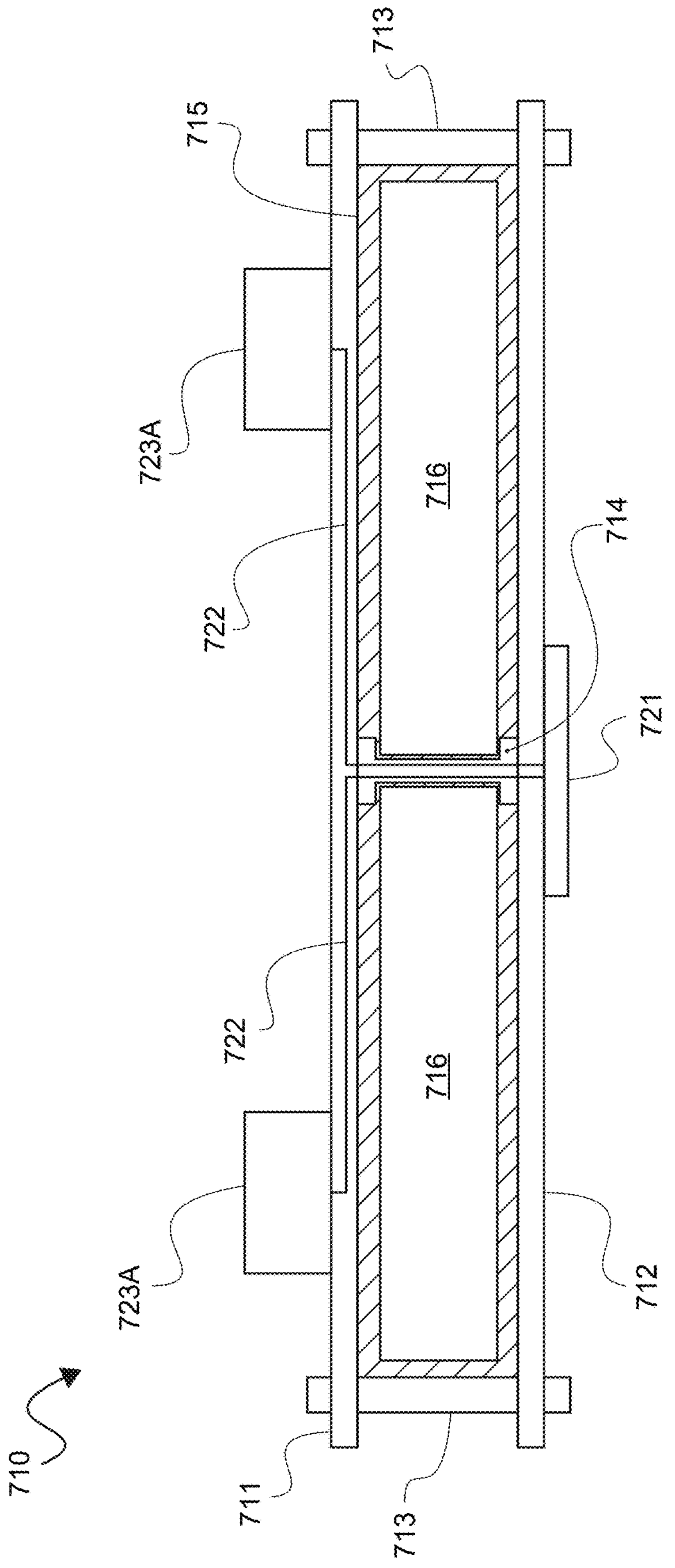
FIGS. 7A-7B show side and top views of a multi-layered motherboard assembly, according to embodiments of the inventive subject matter.
Figure 7B:
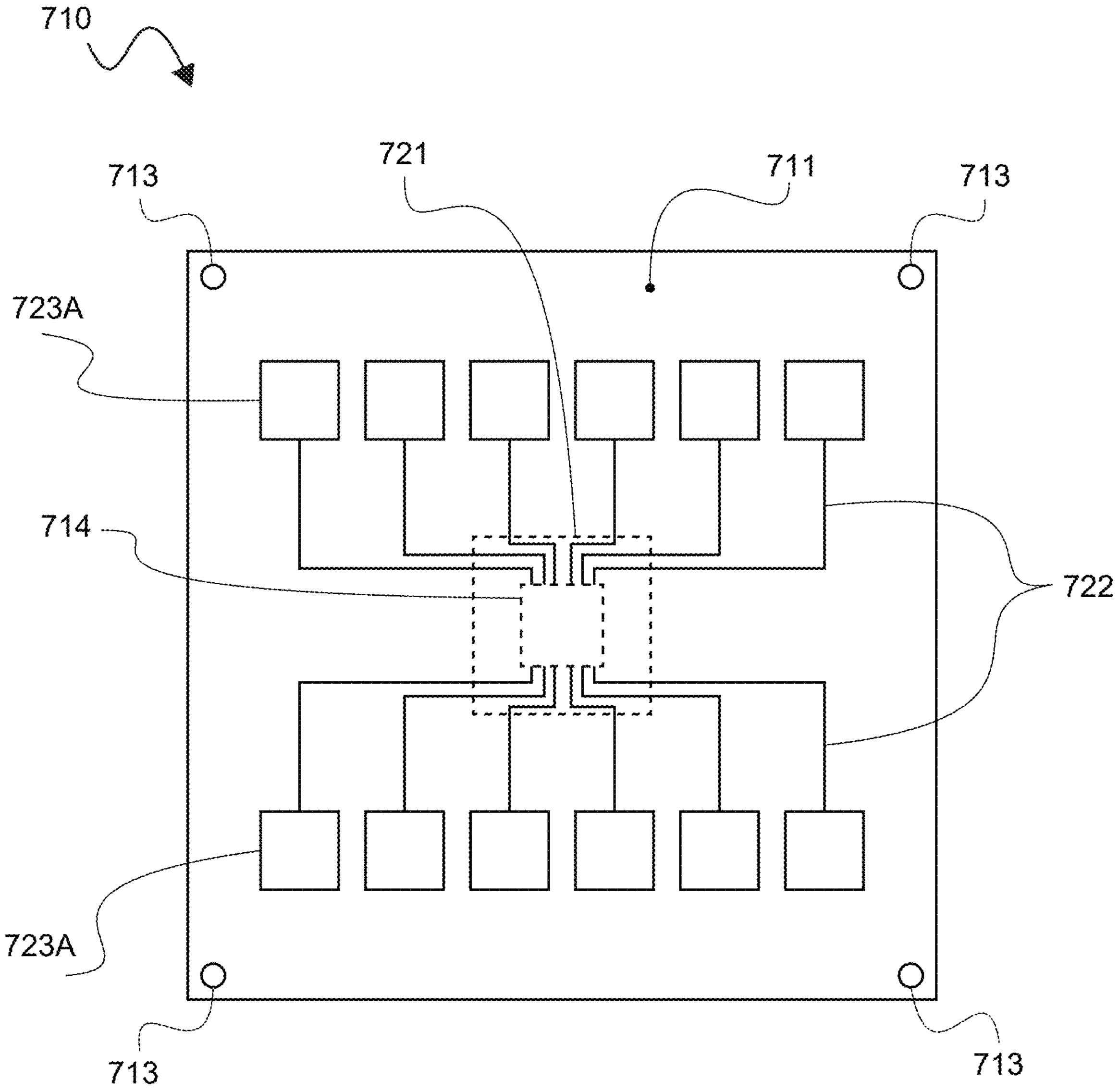

FIGS. 7A-7B show a side and top view, respectively, of a motherboard assembly 710, according to these embodiments of the inventive subject matter.

As seen in FIG. 7A, the motherboard assembly 710 includes an upper motherboard 711 and a lower motherboard 712.

The upper motherboard 711 includes one or more memory channels 723. The embodiment of FIGS. 7A-7B includes me memory component sockets 723A (that are configured to receive a memory component for testing). However, the general structure of the assembly 710 applies to embodiments having memory module slots 723B (that are configured to receive a memory module for testing), illustrated as a part of an assembled system in the embodiment shown in FIG. 9. Thus, for embodiments using module slots 723B, the structure will be the same as the structure shown in FIGS. 7A-7B except that the assembly 710 will have module slots 723B instead of memory component sockets 723A.

Figure 9:
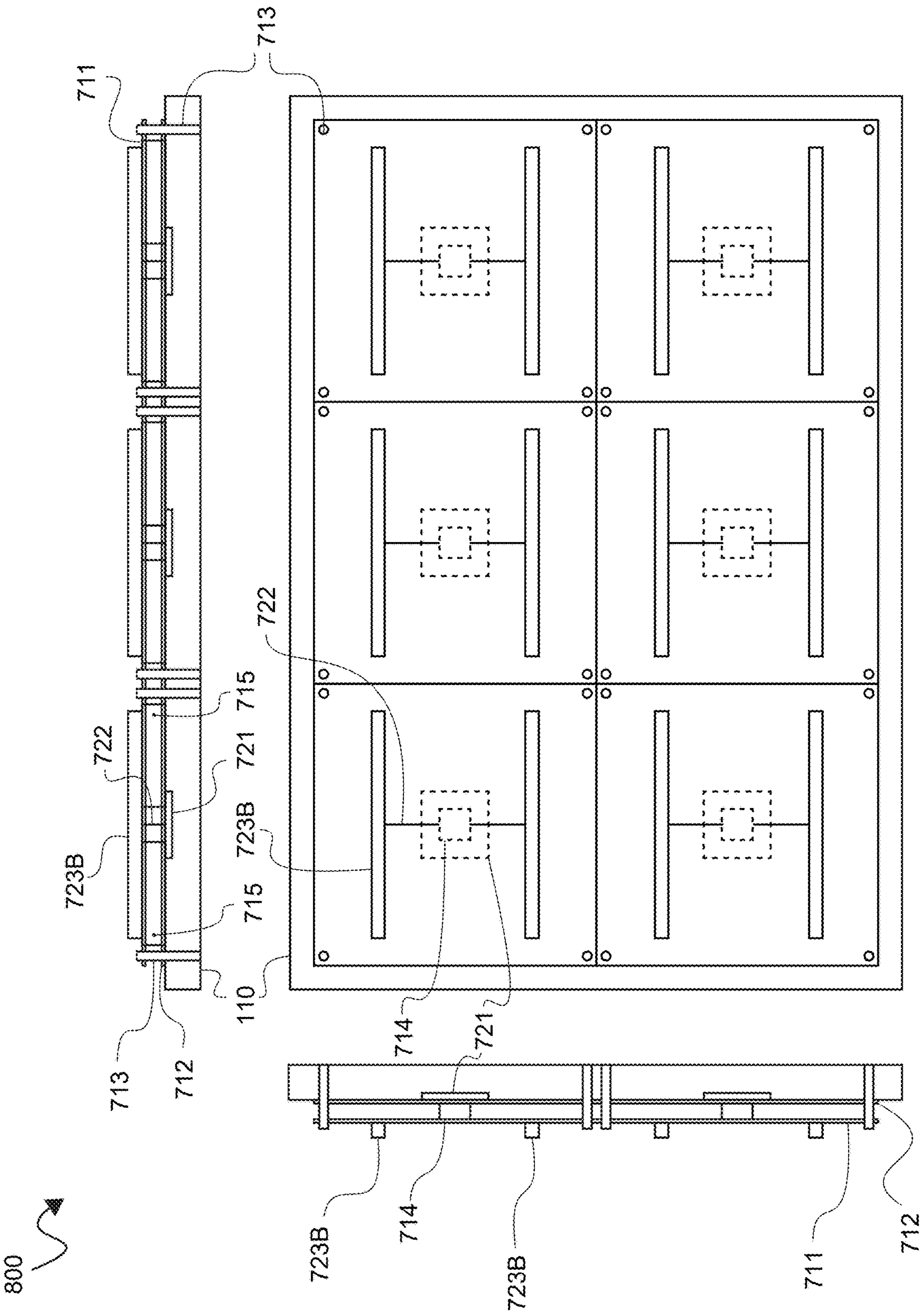
FIG. 9 shows a top and side perspectives of a plurality of motherboard assemblies inserted into a frame to form assembled tester system having memory module slots, according to embodiments of the inventive subject matter.

The memory component sockets 723A of FIGS. 7A-7B can be the same as the memory component sockets 123A of FIGS. 1A and 3A and the memory module slots 723B of FIG. 9 can be the same as the memory module slots 123B of FIGS. 1B and 3B.

The lower motherboard 712 includes a CPU 721 on the underside. The lower motherboard 712 can be coupled with the upper motherboard 711 via support connectors 713. The arrangement of the upper motherboard 711 and lower motherboard 712 is such that the two boards are parallel. In embodiments, the angle of between the upper motherboard 711 and lower motherboard 712 is different by no more than 15 degrees.

In the embodiments of the inventive subject matter shown herein, there is a gap 715 between the upper and lower motherboards 711, 712. The gap 715 between the upper motherboard 711 and the lower motherboard 712 helps separate the CPU 721 from the temperatures applied to memory modules and/or memory components being tested. In embodiments, the gap 715 can be between 1 mm and 100 mm wide.

The CPU 721 is communicatively coupled with the memory component sockets 723A and memory module slots 723B (in the embodiment of FIG. 9) via connectors 722. As shown in FIG. 7A, the connectors 722 connect the components of the upper and lower motherboards 711, 712 via connection column 714. Thus, the connectors traverse the lower motherboard 712, the connection column 714 and the upper motherboard 711 to connect the CPU 721 to the memory component sockets 723A.

In embodiments of the inventive subject matter, the motherboard assembly 710 includes more than one connection column 714. For example, a motherboard assembly 710 can have 2-4 connection columns 714.

Each of the connection columns 714 can carry a plurality of signals via the connectors 722. It is contemplated that each connection column 714 can carry between 100 and 1000 signals each via the connectors 722.

In embodiments of the inventive subject matter, the upper motherboard 711 and lower motherboard 712 can be connected only via the column 714, without the support connectors 713. In other embodiments, the upper motherboard 711 and lower motherboard 712 are connected via the support connectors 713 without the column 714. In these embodiments, the connectors 722 are routed via one or more of the support connectors 713.

In the embodiments of the inventive subject matter shown herein, the gap 715 contains an insulation layer 716 between the upper motherboard 711 and lower motherboard 712.

The insulation layer 716 can be air (e.g., ambient air or an enclosure containing air), a vacuum (e.g., an enclosure that has a vacuum inside), Styrofoam, rubber, etc. The insulation layer can be a layer of material (e.g., Styrofoam) with air or vacuum bubbles. In embodiments such as the one shown here, the insulation layer 716 fills at least 70% of the gap 715.

The motherboard assembly 710 can be used with the frame 110 of FIG. 2 in a similar fashion as motherboard 120 of FIGS. 1A-6. A plurality of motherboard assemblies 710 can be attached to frame 110 to test memory modules or memory components.

When installed on a frame such as frame 110, the lower motherboard 712 can be mounted directly on the frame 110. The insulation layer 716 can be a stiff material with air pockets and spacers made of plastic. This can all then be screwed together with the upper motherboard 711 on top.

Figure 8:
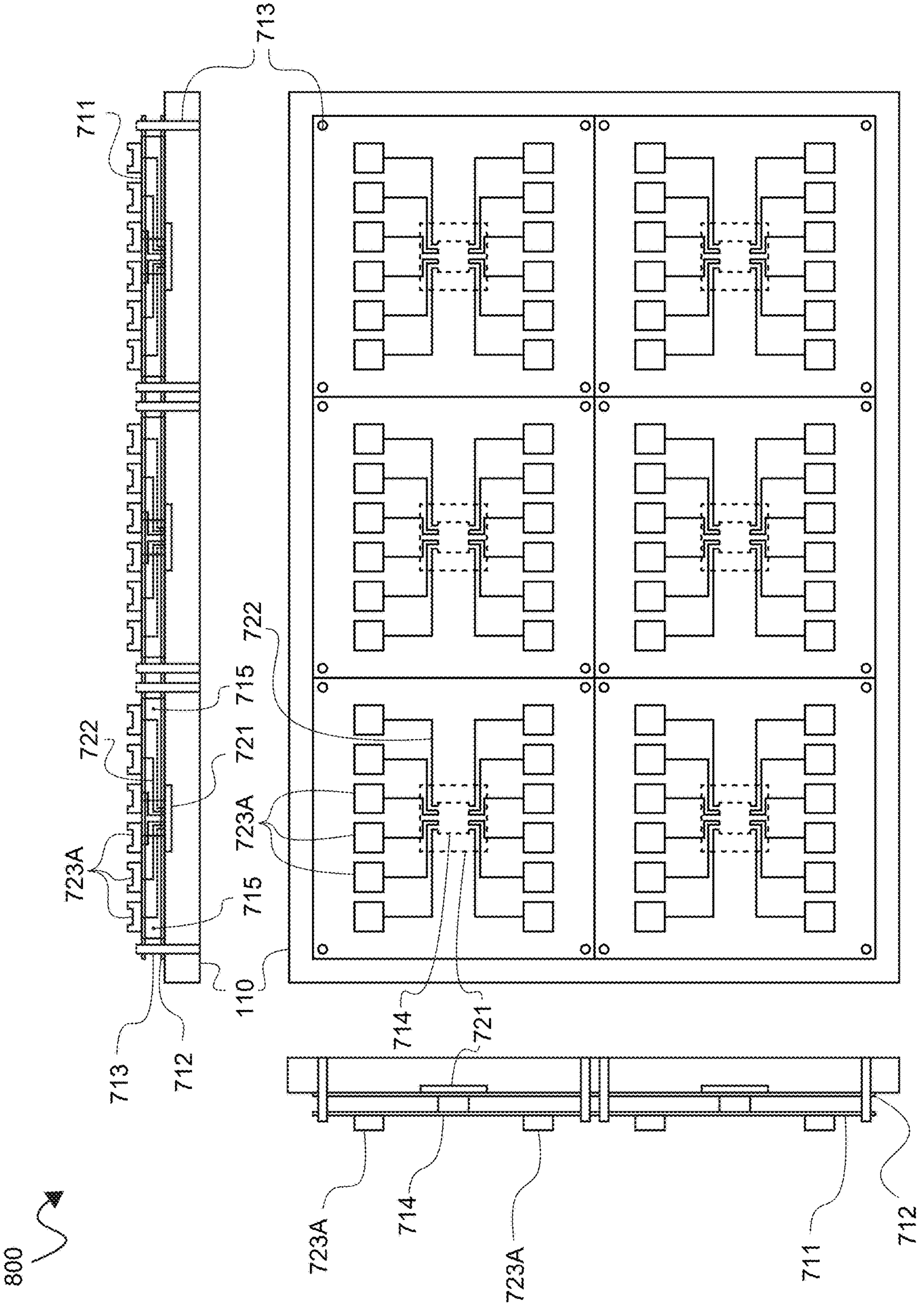
FIG. 8 shows a top and side perspectives of a plurality of motherboard assemblies inserted into a frame to form assembled tester system having memory component sockets, according to embodiments of the inventive subject matter.

FIG. 8 shows a top and side perspectives of a plurality of motherboard assemblies 710 inserted into a frame 110 to form assembled tester system 700. In this example, the motherboard assemblies 710 shown include only memory component sockets 723A. As discussed above, FIG. 9 shows top and side perspectives of a plurality of motherboard assemblies 710 inserted into frame 110, only the motherboard assemblies of FIG. 9 have memory module slots 723B instead of the memory component sockets 723A of FIG. 8.

The assembled tester system 800 of FIG. 8 includes six motherboard assemblies 710 inserted into the frame 110.

In the embodiment shown in FIG. 8, each motherboard assembly 710 has a CPU 721 that connects to two rows of memory component sockets 723A via a connection columns 714. In other embodiments, each motherboard assembly 710 can have more than two rows of memory component sockets 723A for each CPU and can have multiple connection columns 714.

For simplicity, the illustrations of FIGS. 8 and 9 do not show the insulation layer 716 but it is contemplated that this assembly can include embodiments that include the insulation layer 716 as described herein.

In the same manner as the embodiments of FIGS. 1A-6, the embodiments of FIGS. 7-9 can include communications hardware that can include an antenna and other communications components that enable the CPU 721 to exchange data with an external computing device. The antenna can be integral to the CPU 721, or can be separate from the CPU 721. In embodiments where the antenna is separate from the CPU 721, the antenna is also disposed on the lower motherboard 712 to protect it from the testing environment.

As with the embodiments of FIGS. 1A-6, the motherboard assembly 710 can include a connector that is disposed to connect with a corresponding connector of frame 110 such that power can be provided to the motherboard assembly 710.

In embodiments of the inventive subject matter, the upper motherboard 711 and the lower motherboard 712 are of the same or substantially the same area (within 10% of surface area). In other embodiments of the inventive subject matter, the upper motherboard 711 is of a lesser area than the lower motherboard 712, where the difference is more than 10% of the surface area. In these embodiments, the area of difference is protected by an insulating material such as those discussed herein. Protected by an insulating material means that at least 80% of the area of difference is protected by the insulating material.

Wafer Tester

Wafer Tester board system 100 can be used to test a silicon wafer 980. The test can be Known Good Die (KGD) testing at full product speed. The testing is performed by attaching a probe card 900 to motherboards 120.

Figure 10:
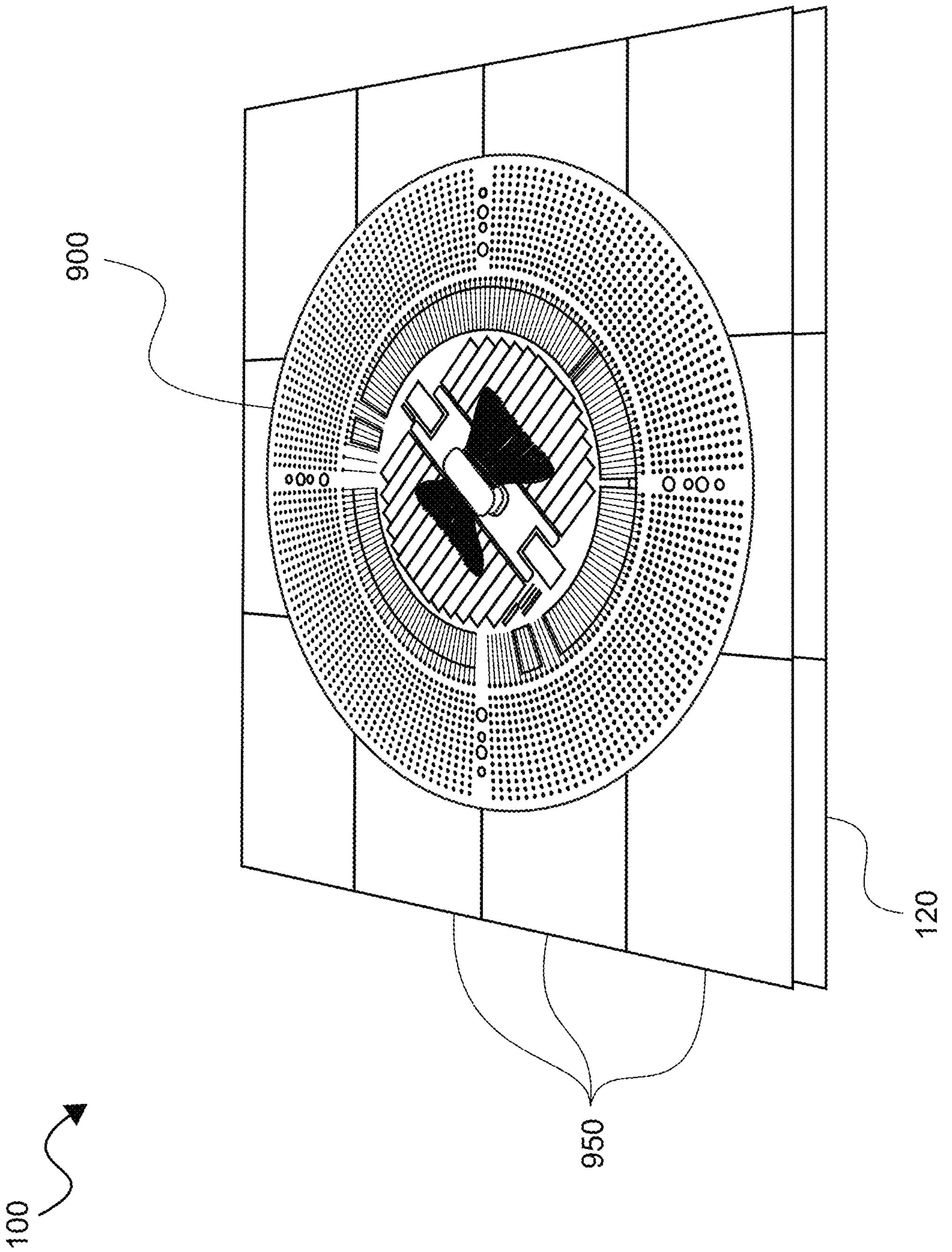
FIG. 10 shows a perspective view of a wafer tester board system comprising a motherboard coupled with a probe card, and a wafer resting on the probe card.
Figure 11:
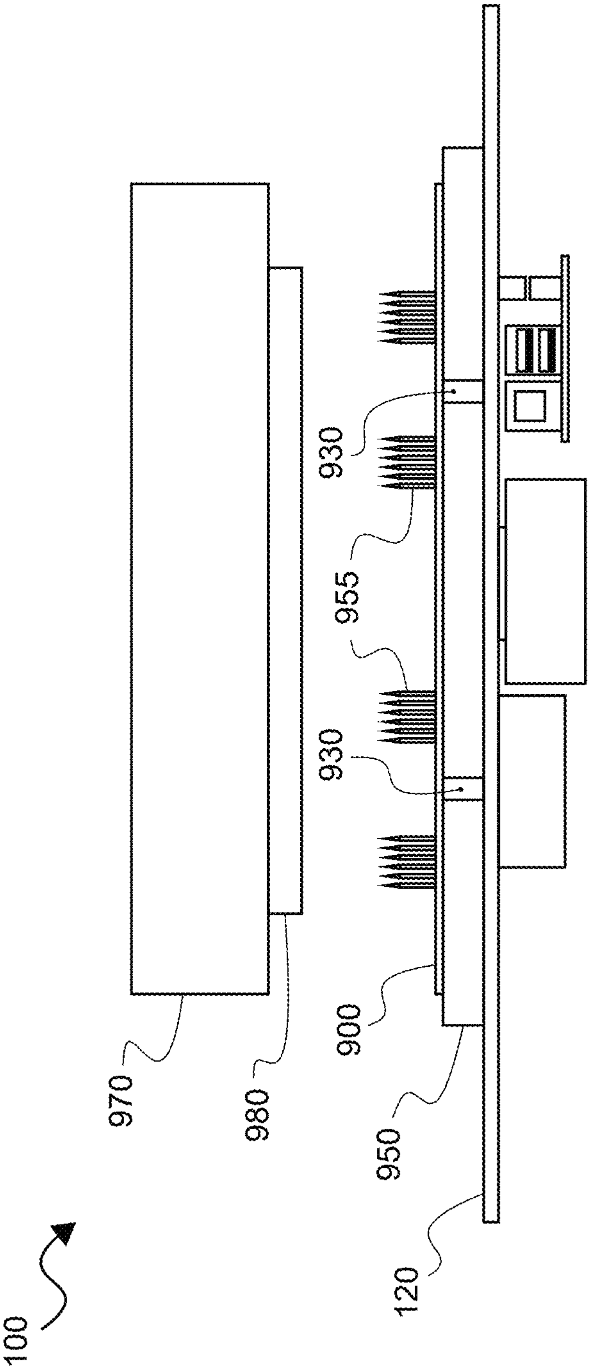
FIG. 11 shows a side view of the wafer tester board system of FIG. 10.

FIG. 10 shows a probe card 900 connected with tester board system 100. FIG. 11 shows a side view of tester board system 100, motherboards 120, probe card 900, and wafer 980. Probe card 900 is attached to tester board system 100 via high-speed micro connectors 930.

Probe card 900 is thermally isolated from motherboards 120 by an air gap and by insulation foam covers 950 to minimize heat transfer during wafer testing from heatable electrostatic wafer chuck 970 to motherboards 120. Wafer 980 is attached to chuck 970 so it can be heated during testing. It is also contemplated that chuck 970 can be replaced with a cooling chamber that provides cooling and prevents icing during testing. Chuck 970 and tester board system 100 are solidly mounted into a frame while wafer 980 can move in x-y-z directions so that probe needles 955 of probe card 900 can contact the entire surface of wafer 980. Typically, a single touch down is not feasible for testing the entire surface of wafer 980 due to the high number of probe needles involved.

It is contemplated that probe card 900 can be connected to motherboards 120 via a single or multiple high speed micro connectors 930. It is also contemplated that probe card 900 could be a single probe card, or split into multiple smaller probe cards.

Figure 12:
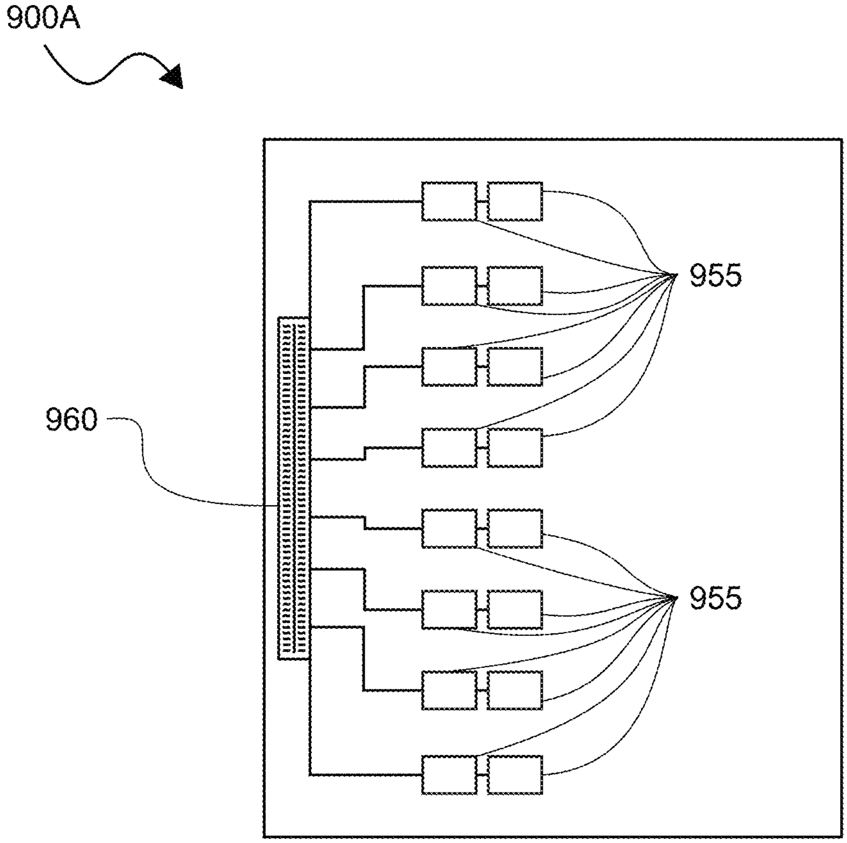
FIG. 12 shows a top view of a first probe card design.

FIG. 12 shows a top view of an individual probe card 900A that connects with one of the motherboards 120. Probe card 900A has a plurality of probes needles 955 and a micro connector 960 that connects to a motherboard 120. In this case, probe card 950A is the same size as an individual tile of the motherboards 120. However, this makes alignment to wafer 980 more difficult because the multiple tiles of motherboard 120 and the probe cards 950A have to be horizontally aligned very precisely with a precision of several micrometers to align exactly with the contact areas on wafer 980. In addition, a tile of motherboard 120 is typically too large to place six probe cards 900A in the area of a single 300 mm wafer area. These problems can be addressed by making a larger probe card that couples with multiple tiles of motherboard 120.

Figure 13:
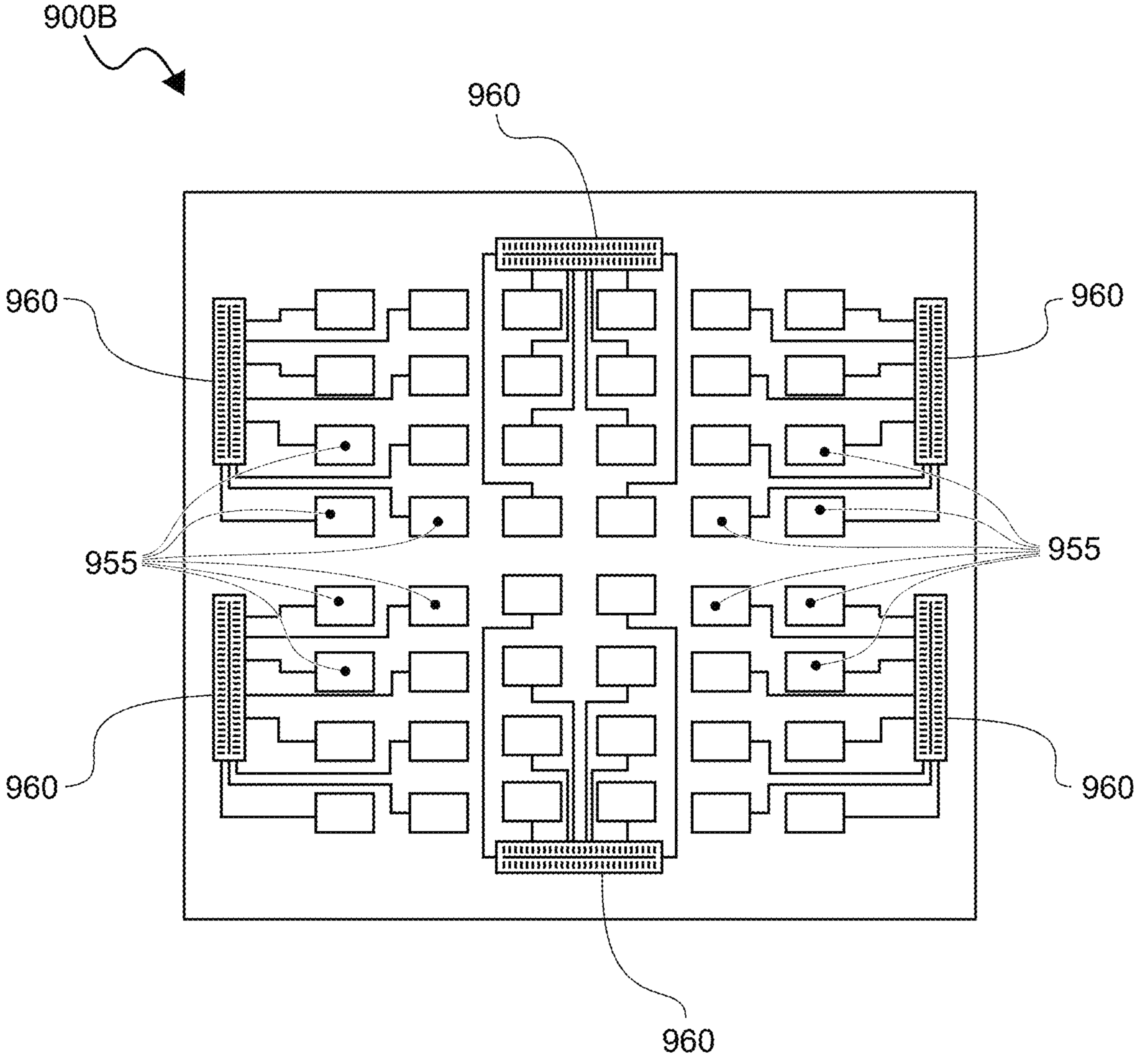
FIG. 13 shows a top view of a second probe card design.

FIG. 13 shows a top view of a larger probe card 900B. Probe card 900B is sized and dimensioned to cover six tiles on motherboard 120. Probe card 900B combines six probe cards 900A into one single PCB (printed circuit board) so they can be mounted with high precision onto a single carrier. Probe card 900B has six micro connectors 960, and each micro connector 960 has its own plurality of probe needles 955. In addition, the placement of micro connectors 960 of probe card **950*b* have been rotated with respect to each other to shorten the routing of the electrical signals to the tester tiles of motherboard 120. This layout also optimizes placement of the probe needles 955 towards the center region of probe card 900B. The center region of 900B is sized and dimensioned to cover the surface area of wafer 980**.

Figure 14B:
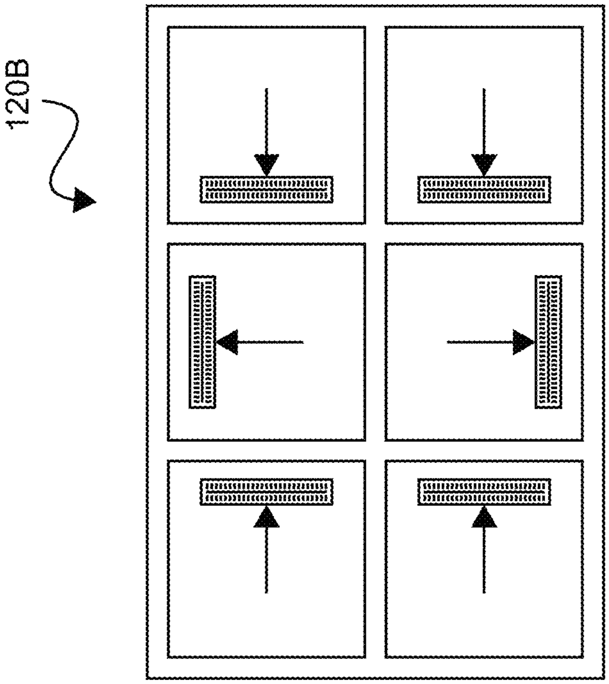
FIG. 14B shows a second tile orientation for a motherboard design.
Figure 14A:
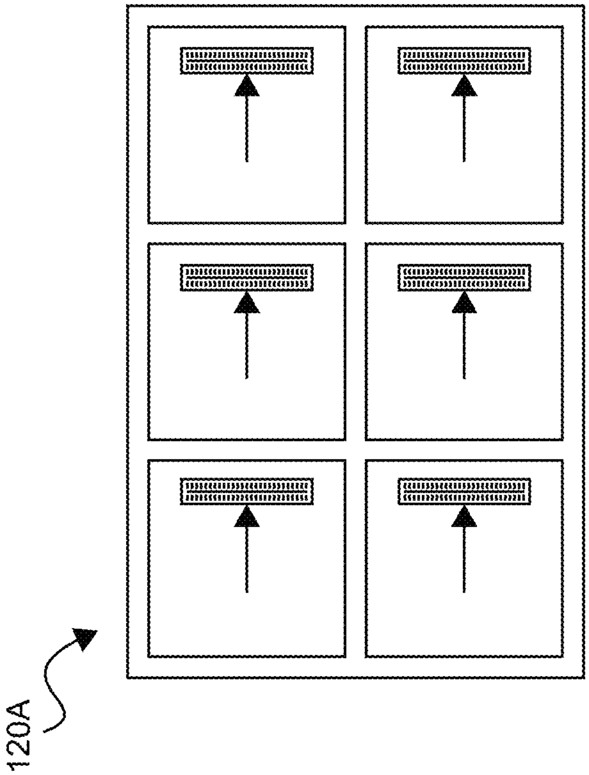
FIG. 14A shows a first tile orientation for motherboard design.

Probe card 900B is designed to mate with a modified tile layout as shown by motherboard 120B in FIG. 14B, in which the tiles have been rotated from their normal orientation as shown by motherboard 120A in FIG. 14A. Motherboard 120B has two middle tiles in the middle column that have been rotated so that their micro connectors are placed towards the outside, and the two tiles in the right column have been rotated so that their micro connectors are placed towards the inside. The two tiles in the left column have their normal orientation, with their micro connectors located towards the inside. The tile orientation of motherboard 120B allows for probe card 900B to have probe needles 955 located at its center and also significantly increase signal speed since the micro connectors on the tiles and probe cards are more closely located to one another. At the same time, motherboard 120B keeps design of tester board system 100 simple since the design of each tester tile is identical.

Figure 15:
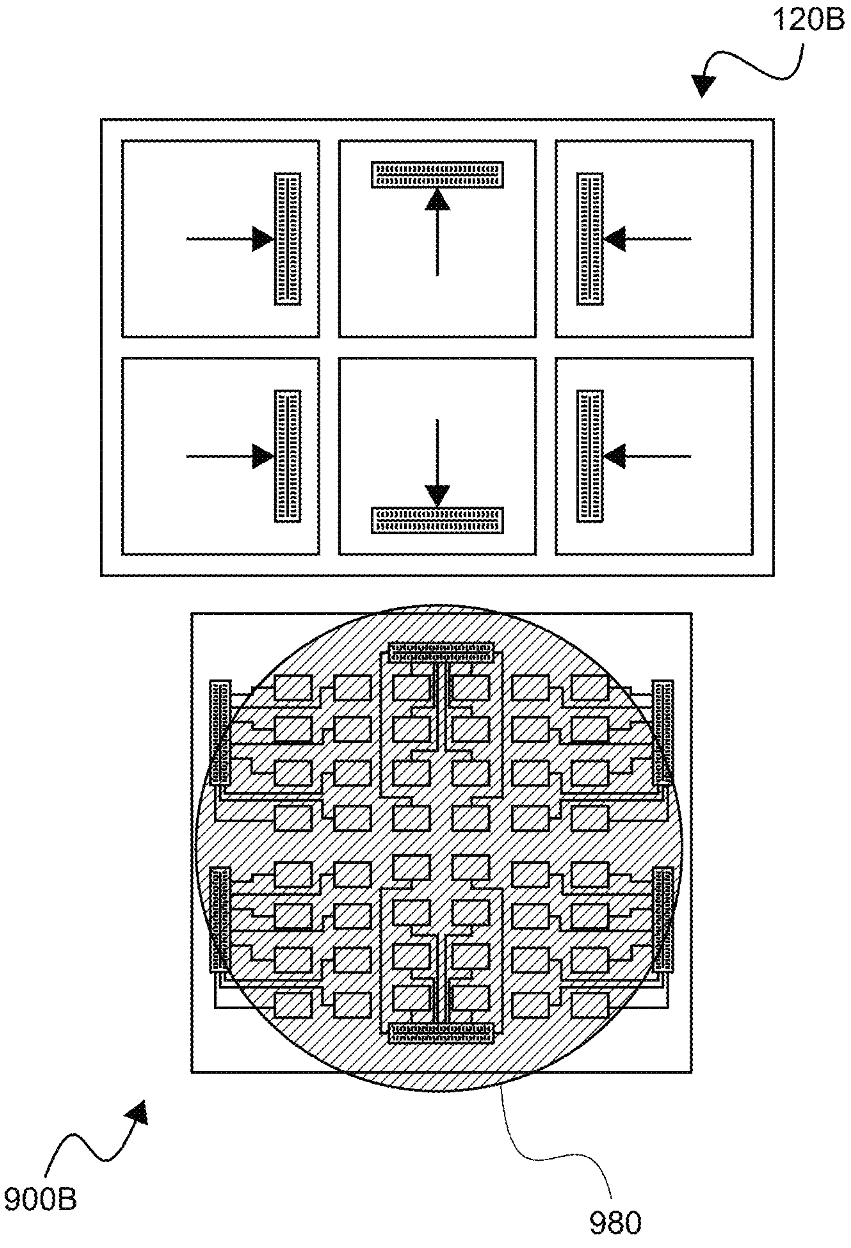
FIG. 15 shows the second tile orientation of 14B side-by-side with the second probe card design of FIG. 13.

FIG. 15 shows motherboard 120B next to probe card 900B. This side-by-side comparison of their layouts shows how the micro connectors of motherboard 120B and the micro connectors of probe card 900B are located close to one another when connected (e.g., when probe card 900B is placed on top of motherboard 120B), thereby minimizing the length of electrical connectors between the two boards. The surface area of wafer 980 is also shown on top of probe card 900B, which shows the majority of the surface area overlays with probe needles 955. It should be appreciated that this arrangement dramatically increases tester signal speed and signal integrity. It should also be appreciated that other arrangements are possible using multiple electrical connectors per tester tile to further shorten electrical signal length. For simplicity, the drawings only show a tester tile with single electrical connector.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A motherboard assembly for wafer testing, comprising:

a probe card having a plurality of needles disposed in a center region and a plurality of micro connectors disposed outside the center region, wherein each micro connector is communicatively coupled with a plurality of needles;

a lower motherboard comprising a plurality of tiles, each tile having at least one processor and at least one memory channel, wherein each memory channel is communicatively coupled with a micro connector of the probe card;

a gap vertically separating the lower motherboard and the probe card; and wherein the plurality of tiles comprises a first tile having a first rotational orientation, a second tile having a second rotational orientation, and a third tile having a third rotational orientation, and the first, second, and third rotational orientations are different from one another.

2. The motherboard assembly of claim 1, wherein each of the plurality of the first, second, and third tiles are identical.

3. The motherboard assembly of claim 2, wherein the second rotational orientation that is 90 degrees from the first rotational orientation, and the third rotational orientation is 180 degrees from the first rotational orientation.

4. The motherboard assembly of claim 1, wherein each memory channel is communicatively coupled with a plurality of needles.

5. The motherboard assembly of claim 1, further comprising a wafer sized and dimensioned to cover the center region of the probe card.

6. The motherboard assembly of claim 1, wherein the needles are disposed on a top surface of the probe card and the micro connectors are disposed on a bottom surface of the probe card.

7. The motherboard assembly of claim 1, further comprising a connection column coupled to the probe card and the lower motherboard.

8. The motherboard assembly of claim 1, further comprising an insulation layer disposed within the gap.

9. The motherboard assembly of claim 1, wherein the plurality of tiles comprises six identical tiles arranged in two rows and three columns.

10. The motherboard assembly of claim 9, wherein the two tiles in the left column have the first rotational orientation, the tile in the top row of the middle column has the second rotational orientation, the two tiles in the right column have the third rotational orientation, and the tile in the bottom row of the middle column has a fourth rotational orientation.

11. The motherboard assembly of claim 10, wherein the second rotational orientation is 90 degrees counterclockwise from the first rotational orientation, the third rotational orientation is 180 degrees from the first rotational orientation, and the fourth rotational orientation is 90 degrees clockwise from the first rotational orientation.

12. A tester board system, comprising:

a frame dimensioned to receive at least two motherboard assemblies; and each of the at least two motherboard assembly comprising:

a probe card;

a plurality of needles disposed on the probe card;

a lower motherboard vertically separated from the probe card by a gap;

at least one processor disposed on the lower motherboard;

at least one support connector connecting the probe card and the lower motherboard;

at least one micro connector disposed on the probe card and communicatively coupling the at least one processor and the plurality of needles; and a plurality of tiles comprises a first tile having a first rotational orientation, a second tile having a second rotational orientation, and a third tile having a third rotational orientation, wherein the first, second, and third rotational orientations are different from one another.

13. The tester board system of claim 12, further comprising a wafer sized and dimensioned to cover a center region of the probe card.

14. The tester board system of claim 12, wherein the plurality of needles are disposed on a top surface of the probe card and the at least one micro connector is disposed on a bottom surface of the probe card.

15. The tester board system of claim 12, wherein the at least one support connector comprises a connection column.

16. The tester board system of claim 12, further comprising an insulation layer disposed within the gap.

17. The tester board system of claim 12, wherein the plurality of tiles comprises six identical tiles arranged in two rows and three columns.

18. The tester board system of claim 17, wherein the two tiles in the left column have the first rotational orientation, the tile in the top row of the middle column has the second rotational orientation, the two tiles in the right column have the third rotational orientation, and the tile in the bottom row of the middle column has a fourth rotational orientation.

19. The tester board system of claim 18, wherein the second rotational orientation is 90 degrees counterclockwise from the first rotational orientation, the third rotational orientation is 180 degrees from the first rotational orientation, and the fourth rotational orientation is 90 degrees clockwise from the first rotational orientation.

20. The tester board system of claim 12, wherein the frame is dimensioned to receive between four and ten motherboard assemblies.

* * * * *